(12) United States Patent
Smith

(10) Patent No.: US 11,772,136 B2
(45) Date of Patent: Oct. 3, 2023

(54) SYSTEM AND METHOD FOR PARTICLE ABATEMENT IN A WAFER PROCESSING TOOL

(71) Applicant: Eryn Smith, Danville, CA (US)

(72) Inventor: Eryn Smith, Danville, CA (US)

(*) Notice: Subject to any disclaimer, the term of this patent is extended or adjusted under 35 U.S.C. 154(b) by 289 days.

(21) Appl. No.: 17/470,946

(22) Filed: Sep. 9, 2021

(65) Prior Publication Data
US 2021/0402445 A1 Dec. 30, 2021

Related U.S. Application Data

(63) Continuation-in-part of application No. 16/985,141, filed on Aug. 4, 2020, now Pat. No. 11,335,581, which is a continuation-in-part of application No. 29/700,100, filed on Jul. 31, 2019, now Pat. No. Des. 913,256.

(51) Int. Cl.
B08B 6/00 (2006.01)
H01L 21/677 (2006.01)
H01L 21/683 (2006.01)

(52) U.S. Cl.
CPC .......... B08B 6/00 (2013.01); H01L 21/67739 (2013.01); H01L 21/67769 (2013.01); H01L 21/6833 (2013.01)

(58) Field of Classification Search
CPC . B08B 6/00; H01L 21/6833; H01L 21/67769; H01L 21/67739
See application file for complete search history.

(56) References Cited

U.S. PATENT DOCUMENTS

| D926,716 S | 8/2021 | Smith | |
|---|---|---|---|
| 2015/0171230 A1* | 6/2015 | Kapur | H01L 31/022441 438/98 |
| 2016/0379862 A1* | 12/2016 | Smith | H01L 21/67092 156/273.1 |

* cited by examiner

Primary Examiner — Adolf D Berhane
Assistant Examiner — Afework S Demisse

(57) ABSTRACT

A method for particle abatement in a wafer processing tool implements at least one cleaning-purposed mobile electrostatic carrier (MESC) including electrostatic field generating (EFG) circuits. Each EFG circuit is charged with the cleaning-purposed MESC. The cleaning-purposed MESC is then loaded into the wafer processing tool in a facedown orientation. A normal-purposed MESC is loaded into the wafer processing tool in a faceup orientation. Next, foreign materials are bonded to the cleaning-purposed MESC as the cleaning-purposed MESC is moved along a processing path through the wafer processing tool in the facedown orientation. The normal-purposed MESC travels the processing path during normal operation of the wafer processing tool in the faceup orientation. The cleaning-purposed MESC is then unloaded from the wafer processing tool. Next, the foreign materials are debonded from the cleaning-purposed MESC by discharging each EFG circuit with the cleaning-purposed MESC. Finally, the foreign materials are removed off the cleaning-purposed MESC.

7 Claims, 17 Drawing Sheets

SYSTEM AND METHOD FOR PARTICLE ABATEMENT IN A WAFER PROCESSING TOOL

The current application is a continuation-in-part (CIP) application of the U.S. non-provisional application Ser. No. 16/985,141 filed on Aug. 4, 2020. The U.S. non-provisional application Ser. No. 16/985,141 is a CIP application of the U.S. non-provisional application Ser. No. 29/700,100 filed on Jul. 31, 2020.

FIELD OF THE INVENTION

The present invention generally relates to a method using a mobile electrostatic carrier (MESC) system for particle abatement in semiconductive wafer processing tools. More specifically, the present invention is using a MESC to reduce foreign materials (FM) inside wafer processing systems.

BACKGROUND OF THE INVENTION

With the advent of new technology, people are more reliant on electronic devices/systems in their daily routine. This causes an increase in manufacturing and producing of electronic devices and systems. Manufacturing of smaller and smaller end user products has driven the semiconductor manufactures to continually decrease the size and power consumption of semiconductors.

The continued decrease in device size has caused a variety of challenges to the manufacturer. Currently, the semiconductive wafers are processed in controlled environments with very low FM contamination (i.e., cleanrooms use a high-efficiency particulate air (HEPA) and ultra-low penetration air (ULPA) filtration to help capture airborne FM's). However, one concern is the particulate accumulation on the processing tools, which causes a myriad of issues discussed below and is well known in the prior art. Moreover, there are few cost-effective and high-yielding technologies to remove FM from the wafer stages in the processing tools without a full teardown and clean. This poses a significant challenge to the efficient workflow of the manufacturing processes because a full tear down is costly and causes the processing tools to be out of production for extended periods of time. Work has been done with tacky wafers and tapes to remove FM's, but these technologies are not suitable in highly integrated semiconductor manufacturing (i.e., less than 14-nanometer technology) because the tacky/tapes cause a technological hurdle as the semiconductive wafers can be hard to remove, and there can be residues that are not easy to remove/clean.

Therefore, an objective of the present invention is to run a charged MESC face down through the processing tool, which can be, but is not limited to, a lithography system, an etch system, a deposition system, a similar system known in the art, or a combination thereof. The charged MESC can then use electrostatic forces to attract the FM's from the processing tools or specific parts of the processing tools (e.g., chuck/platen). Upon removal of the FM from the processing tool by the charged MESC, the charged MESC can then be easily cleaned in a standard manner that is known well in the art.

DETAILED DESCRIPTION OF THE INVENTION

All illustrations of the drawings are for the purpose of describing selected versions of the present invention and are not intended to limit the scope of the present invention.

Figure 1:
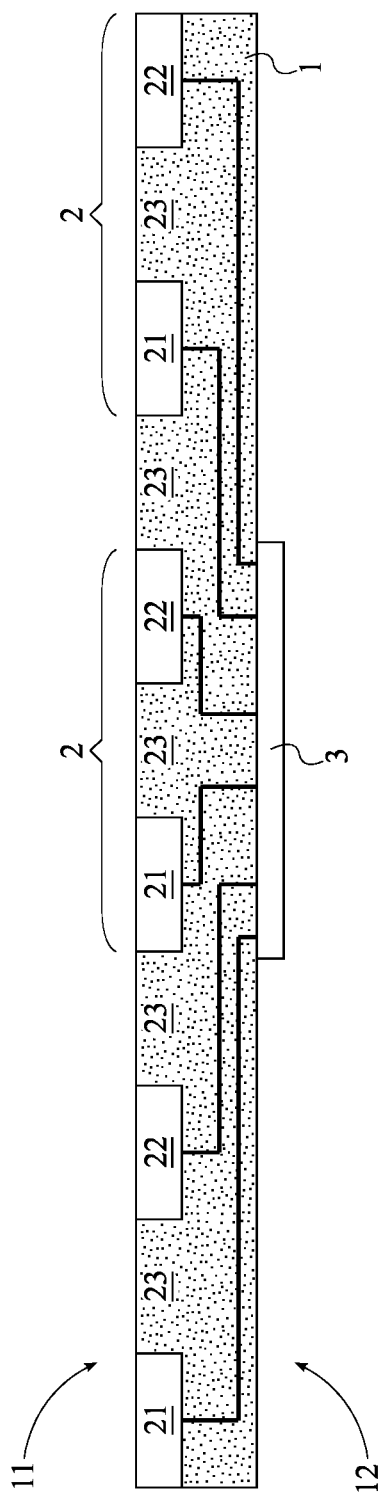
FIG. 1 is a schematic view of the major components of a mobile electrostatic carrier (MESC).
Figure 4:
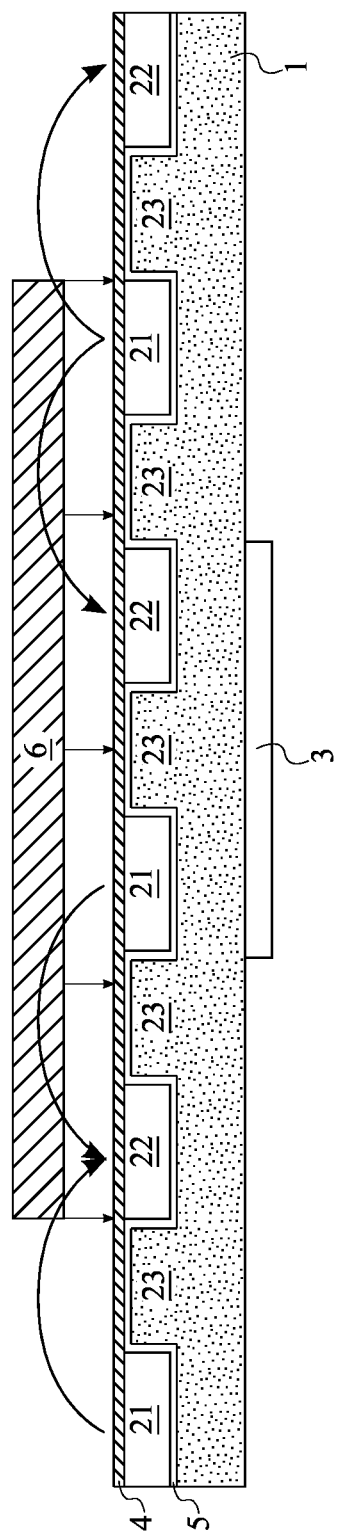
FIG. 4 is a side schematic view of the MESC implementing an electrostatic field to bond a semiconductive wafer to the MESC.
Figure 5:
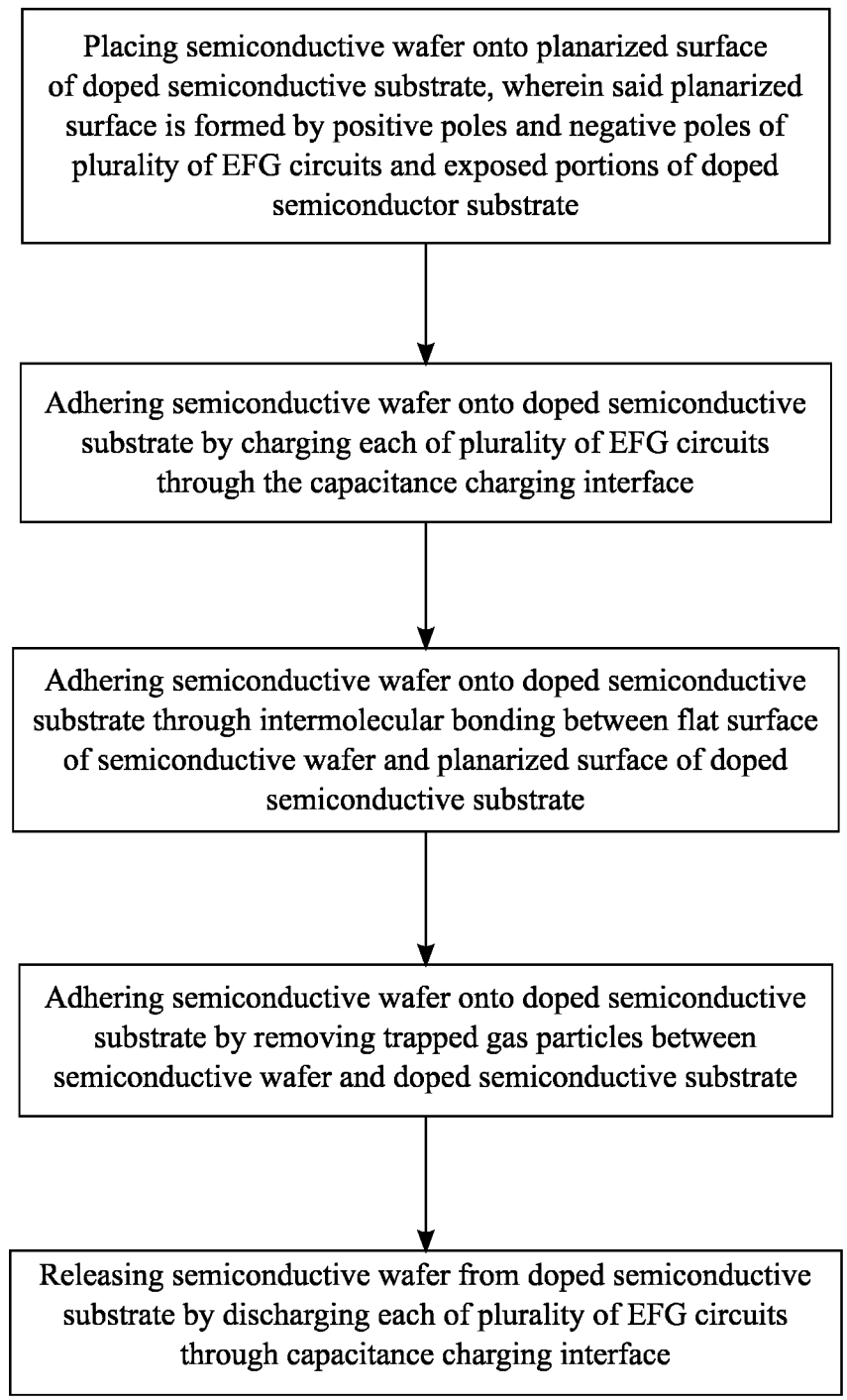
FIG. 5 is a flowchart illustrating how three modes of adhesion are used to bond the semiconductive wafer to the MESC.

As can be seen in FIGS. 1 and 4, the present invention is a mobile electrostatic carrier (MESC) that is used to handle and transport semiconductive wafers or coupons because of the thin, flimsy nature of these wafers or coupons. Different modes of adhesion are used to hold a semiconductive wafer upon the present invention, which outlined in FIG. 5. In addition, the present invention can be used to bond and carry many different sizes of semiconductive wafers or coupons. The MESC comprises a doped semiconductive substrate 1, a plurality of electrostatic field generating (EFG) circuits 2, and a capacitance charging interface 3. The doped semiconductive substrate 1 is used as a base to connect the other components of the present invention together and allows for a semiconductive wafer 6 to be properly situated upon the present invention. The doped semiconductive substrate 1 is either made of a p-type semiconductor material or an n-type semiconductor material that is used in combination with the plurality of EFG circuits 2 in order to generate a non-uniform electrostatic field, which is used to bond the semiconductive wafer 6 to the present invention. The plurality of EFG circuits 2 is distributed across the doped semiconductive substrate 1 so that a semiconductive wafer 6 can be adhered anywhere across the doped semiconductive substrate 1. The capacitance charging interface 3 is used to selectively charge or discharge the doped semiconductive substrate 1 and the plurality of EFG circuits 2. Essentially, the capacitance charging interface 3 is used to turn on or to turn off the non-uniform electrostatic field.

One mode of adhesion implemented by the present invention is the non-uniform electrostatic field that is generated by the plurality of EFG circuits 2. Each of the plurality of EFG circuits 2 comprises a positive pole 21, a negative pole 22, and a biased pole 23. The positive pole 21 and the negative pole 22 are antennas that are respectively provided with a positive charge and a negative charge, which generates an electrostatic field from the positive pole 21 to the negative pole 22. These antennas are designed to be highly resistive so that each antenna is able to hold a larger charge and, thus, is able to increase the capacitance between the positive pole 21 and the negative pole 22. The electrostatic field generated by each of the plurality of EFG circuits 2 will be used to hold a semiconductive wafer 6 on the doped semiconductive substrate 1. For the present invention, the plurality of EFG circuits 2 will apply a greater bonding energy on materials with a lower resistivity. Conceptually, materials with a lower resistivity have more impurities, and the electrostatic field lines emanating from the plurality of EFG circuits 2 can more easily grasp onto these impurities. For example, semiconductive materials such as aluminum have a relatively large amount of impurities, and, thus, the plurality of EFG circuits 2 can more easily bond with aluminum. However, pure materials such as quartz, sapphire, or diamond have a relatively small amount of impurities, and, thus, the plurality of EFG circuits 2 cannot easily bond to these pure materials.

When a semiconductive wafer 6 is being held by the present invention, the semiconductive wafer 6 is situated upon a first face 11 of the doped semiconductive substrate 1. Consequently, the positive pole 21 and the negative pole 22 are embedded in the doped semiconductive substrate 1 from the first face 11 so that the electrostatic field produced by the positive pole 21 and the negative pole 22 can interact with the semiconductive wafer 6. The positive pole 21 and the negative pole 22 are offset from each other across the first face 11 by a specified gap, which spans across an exposed portion of the doped semiconductive substrate 1. The exposed portion is used as the biased pole 23 for each of the plurality of EFG circuits 2. Moreover, the bonding strength of the electrostatic field is proportionately dependent on the capacitance between the positive pole 21 and the negative pole 22. The present invention can increase the capacitance between the positive pole 21 and the negative pole 22 by using the doped semiconductive substrate 1 itself and the biased pole 23, and, thus, the present invention can increase the bonding strength of the electrostatic field. When the biased pole 23 is either positively or negatively charged by the capacitance charging interface 3, the doped semiconductive substrate 1 produces an enrichment or depletion zone within the semiconductive wafer 6, each of which is located adjacent to the biased pole 23 and is located in between the positive pole 21 and the negative pole 22. The location of the enrichment or depletion zone allows the present invention to adjust the capacitance between the positive pole 21 and the negative pole 22. Thus, the present invention can adjust the dielectric properties of the semiconductive wafer 6 through the creation of the enrichment or depletion zone. For example, the enrichment or depletion zone can be used to increase the dielectric constant and, in turn, increase the capacitance between the positive pole 21 and the negative pole 22. This increase in capacitance between the positive pole 21 and the negative pole 22 creates a stronger bonding force between the semiconductive wafer 6 and the present invention.

Figure 3:
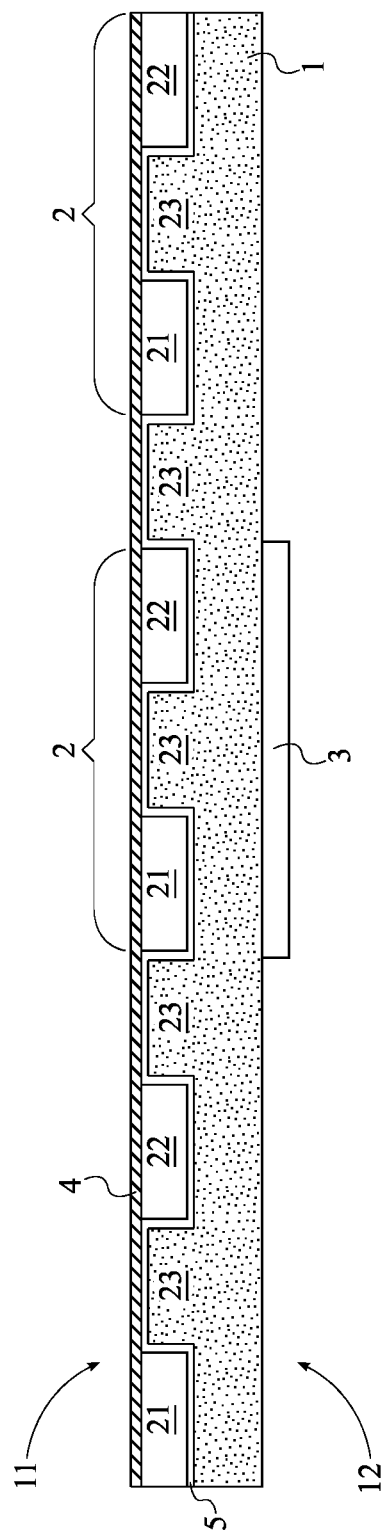
FIG. 3 is a side schematic view of the MESC with the insulative film and the polishing film.

The size of the specified gap between the positive pole 21 and the negative pole 22 is determined by two factors: the size of semiconductive wafers being carried by the present invention and the operational voltage range of the present invention. The size of the semiconductive wafers determines the size of the specified gap because the present invention can grasp a smaller semiconductive wafer with a smaller specified gap between the positive pole 21 and the negative pole 22. However, a smaller specified gap would more likely cause a corona discharge between the positive pole 21 and the negative pole 22. The operational voltage range of the present invention also determines the size of the specified gap because the present invention can more securely grasp a semiconductive wafer with a higher operational voltage range. However, a higher operational voltage range would more likely cause a corona discharge between the positive pole 21 and the negative pole 22. The present invention should be designed to adequately grasp the semiconductive wafers without causing a corona discharge by selecting the appropriate size for the specified gap and by selecting the appropriate operational voltage for the present invention. Thus, the appropriate size for the specified gap and the appropriate operational voltage are also chosen to accommodate a specific size or kind of semiconductive wafer. In addition, an insulative film 5 shown in FIG. 3 is positioned between the positive pole 21 and the doped semiconductive substrate 1 and is positioned between the negative pole 22 and the doped semiconductive substrate 1, which prevents an electrical current from passing from the negative pole 22, through an exposed portion of the doped semiconductive substrate 1, and to the positive pole 21. In one embodiment of the present invention, the doped semiconductive substrate 1 is made of silicon, which is oxidized on the outer surface in order to form the insulative film 5.

A second mode of adhesion implemented by the present invention is a dipole-dipole bonding between flat surfaces of the present invention and the semiconductive wafer 6. In order to implement this mode of adhesion for the present invention, the positive poles 21 and the negative poles 22 need to be flush with the exposed portions of the doped semiconductive substrate 1. Consequently, a planarized surface is formed by the positive poles 21 and the negative poles 22 of the plurality of EFG circuits 2 and the exposed portions of the doped semiconductive substrate 1. This kind of intermolecular bonding needs to occur between the planarized surface of the doped semiconductive substrate 1 and a flat surface of the semiconductive wafer 6. In addition, a polishing film 4 shown in FIG. 3 is superimposed upon the planarized surface in order to enhance the dipole-dipole bonding between the present invention and the semiconductive wafer 6. The polishing film 4 is also used as an insulator that further prevents corona discharge from the positive pole 21 to the negative pole 22.

A third mode of adhesion implemented by the present invention is to remove trapped gas particles between the semiconductive wafer 6 and the doped semiconductive substrate 1 in order to form a better intermolecular bond between the planarized surface of the doped semiconductive substrate 1 and a flat surface of the semiconductive wafer 6. In order to implement this mode of adhesion for the present invention, the semiconductive wafer 6 is bonded to the present invention placed into a kind of vacuum chamber. Once the vacuum chamber is activated, the trapped gas particles are exhausted from the space between the semiconductive wafer 6 and the doped semiconductive substrate 1.

Figure 7:
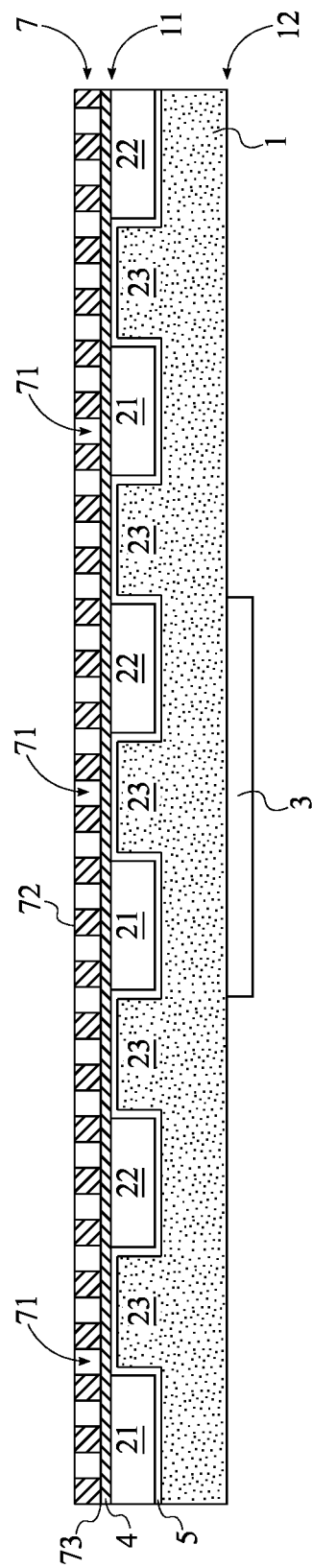
FIG. 7 is a side schematic view of the MESC with the insulative film, the polishing film, and the layer of patterned material.
Figure 8:
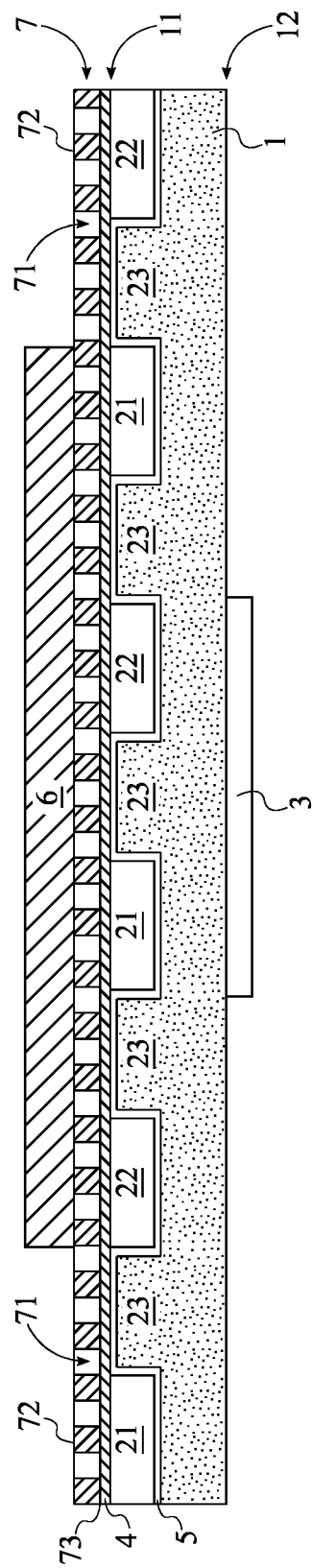
FIG. 8 is a side schematic view of the MESC implementing a vacuum seal with each cavity of the layer of patterned material to further bond the semiconductive wafer to the MESC.

A fourth mode of adhesion implemented by the present invention uses a layer of patterned material 7 in order to further adhere the semiconductive wafer 6 onto the MESC with a vacuum, which can be seen in FIG. 8. The fourth mode of adhesion is useful to create a hermetic seal between the semiconductive wafer 6 and the bonding surface of the MESC so that when the semiconductive wafer 6 is put through any kind of manufacturing process involving liquids, the liquid is not able to migrate in between the semiconductive wafer 6 and the bonding surface of the MESC and is not able to disrupt the manufacturing process. The fourth mode of adhesion also allows for the hermetic seal between the semiconductive wafer 6 and the bonding surface of the MESC to withstand high shear loads. The layer of patterned material 7 is preferably a polymer and is superimposed onto the bonding surface of the MESC. The layer of patterned material 7 comprises an exposed surface 72, an unexposed surface 73, and a plurality of cavities 71, which are shown in FIG. 7. The exposed surface 72 allows the semiconductive wafer 6 to be situated upon the layer of patterned material 7, and the unexposed surface 73 is situated upon the bonding surface of the MESC. Each of the plurality of cavities 71 is used to generate a micro-vacuum that allows the present invention to further adhere the semiconductive wafer 6 onto the MESC. The plurality of cavities 71 is distributed across the layer of patterned material 7 so that the layer of patterned material 7 is able to provide additional adhesion force across the entire bonding surface of the MESC. Each of the plurality of cavities 71 traverses into the layer of patterned material 7 from the exposed surface 72 towards the unexposed surface 73, which properly orients the adhesion force from the micro-vacuum generated by each of the plurality of cavities 71. The fourth mode of adhesion is an improvement over the third mode of adhesion for the present invention because the fourth mode of adhesion simply relocates any trapped gas particles in between the semiconductive wafer 6 and the bonding surface of the MESC into the plurality of cavities 71.

Figure 9:
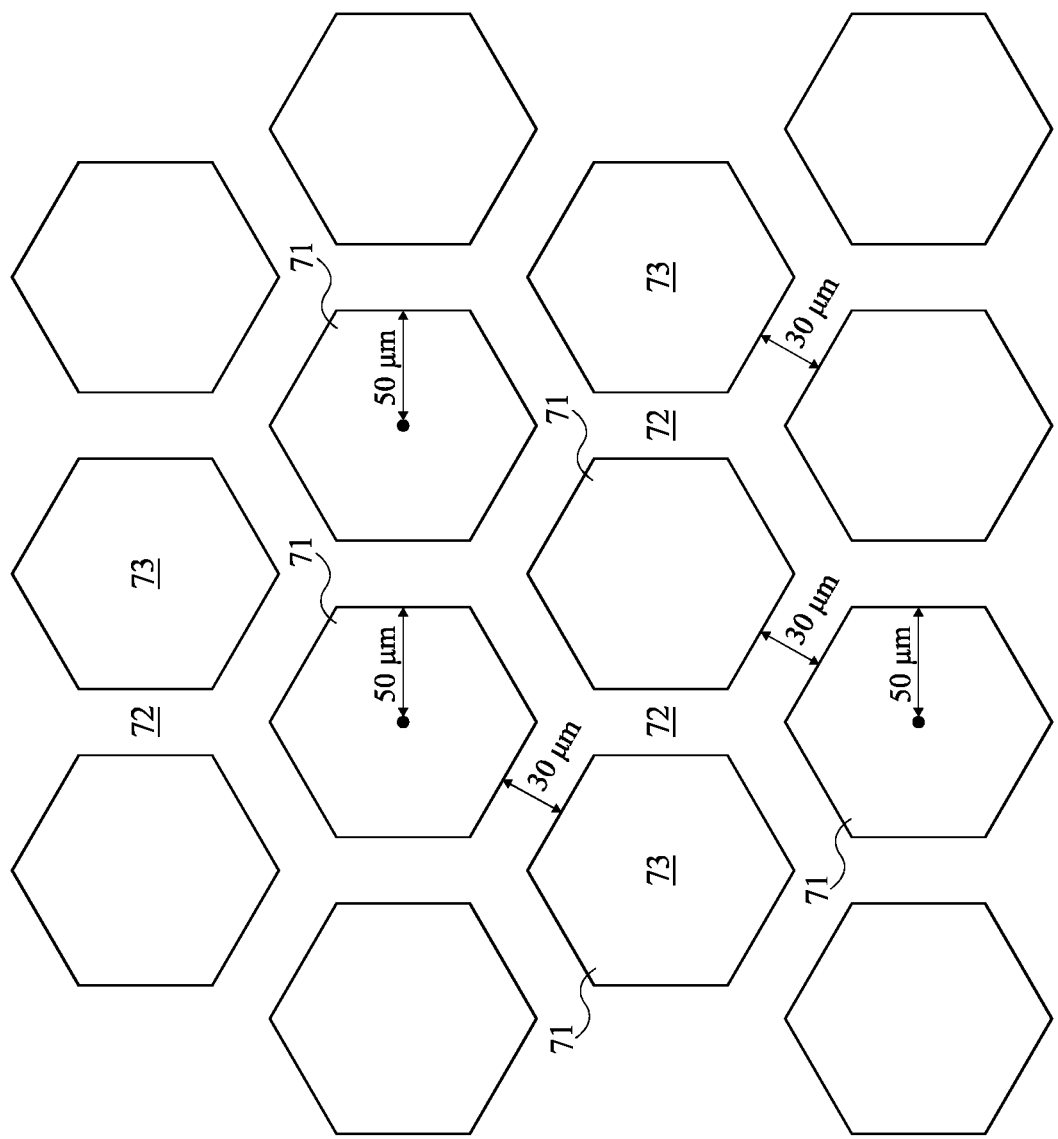
FIG. 9 is a top schematic view for the layer of patterned material, wherein the layer of patterned material is configured into a honeycomb-shaped structure.

In preferred embodiment of the present invention shown in FIG. 9, the cross-section for each of the plurality of cavities 71 is a regular hexagonal shape, which allows the layer of patterned material 7 to emulate a honeycomb-shaped structure. More specifically, an apothem of the regular hexagonal shape is 50 micrometers, and each of the plurality of cavities 71 is offset amongst each other by a 30-micrometer gap, which are the optimal dimensions for the layer of patterned material 7. However, the layer of patterned material 7 can be designed with different dimensions and still be fully functional. Also in the preferred embodiment of the present invention, each of the plurality of cavities 71 traverses all the way through the layer of patterned material 7 from the exposed surface 72, through the unexposed surface 73, and to the bonding surface of MESC. However, in some embodiments of the present invention, each of the plurality of cavities 71 may only partially traverse into the layer of patterned material 7 without reaching the bonding surface of the MESC.

One method of manufacturing the layer of patterned material 7 onto the bonding surface of the MESC needs the layer of patterned material 7 to be made of a photosensitive material. First, a uniform layer of the photosensitive material is applied to the bonding surface of the MESC. Second, the layer of photosensitive material is then exposed with a masking pattern so that the plurality of cavities 71 burrows through the uniform layer of photosensitive material in order to create the layer of patterned material 7.

Figure 10:
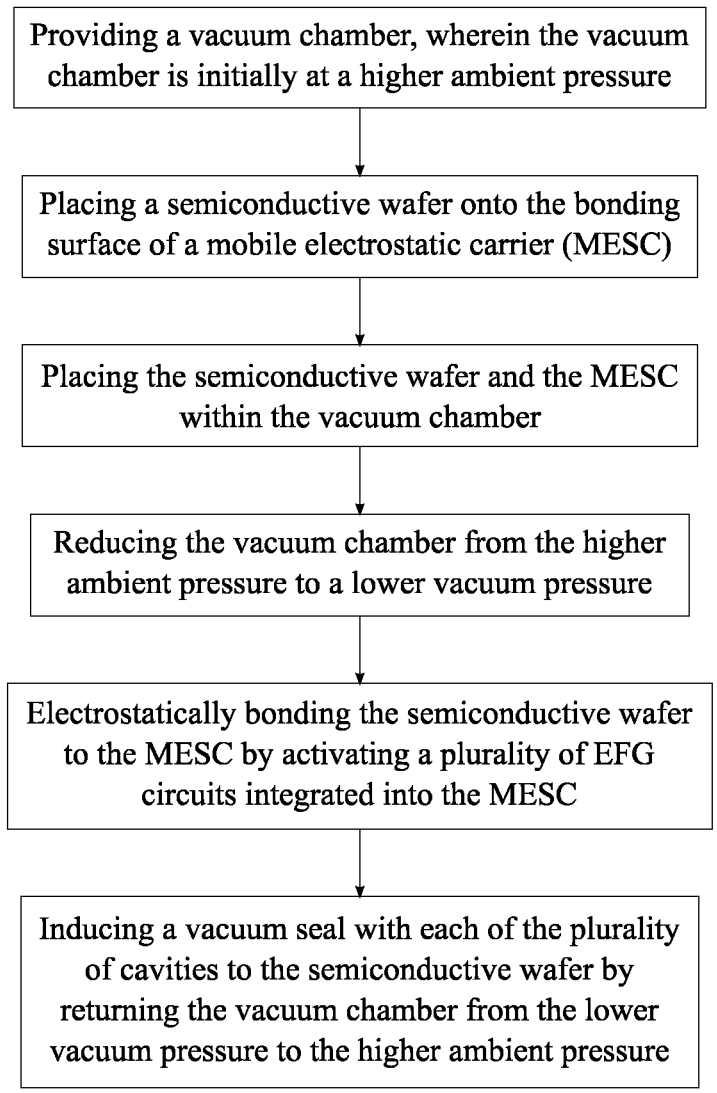
FIG. 10 is flowchart illustrating how to induce the vacuum seal with each cavity of the layer of patterned material through the use of a vacuum chamber.

In order for the fourth mode of adhesion to be actuated for the present invention, the following procedure outlined in FIG. 10 needs to be implemented with the MESC, the layer of patterned material 7, and a vacuum chamber. The vacuum chamber is able to hermetically seal off itself and lower its internal pressure to a near vacuum. Before the vacuum chamber hermetically seals off itself, the vacuum chamber is initially at a higher ambient pressure. The procedure begins by placing the semiconductive wafer 6 onto the bonding surface of the MESC and then placing the semiconductive wafer 6 and the MESC within the vacuum chamber. After the vacuum chamber is hermetically seals off itself, the procedure continues by reducing the vacuum chamber from the higher ambient pressure to the lower vacuum pressure, which extracts the gas retained within each of the plurality of cavities 71. The semiconductive wafer 6 is then electrostatically bonded to the MESC by activating the plurality of EFG circuits 2 for the present invention so that each of the plurality of cavities 71 is hermetically sealed by the semiconductive wafer 6 pressing against the layer of patterned material 7. Finally, a vacuum seal with each of the plurality of cavities 71 is induced by returning the vacuum chamber from the lower vacuum pressure to the higher ambient pressure, which allows the semiconductive wafer 6 to be further adhered to the MESC through a vacuum.

Figure 11:
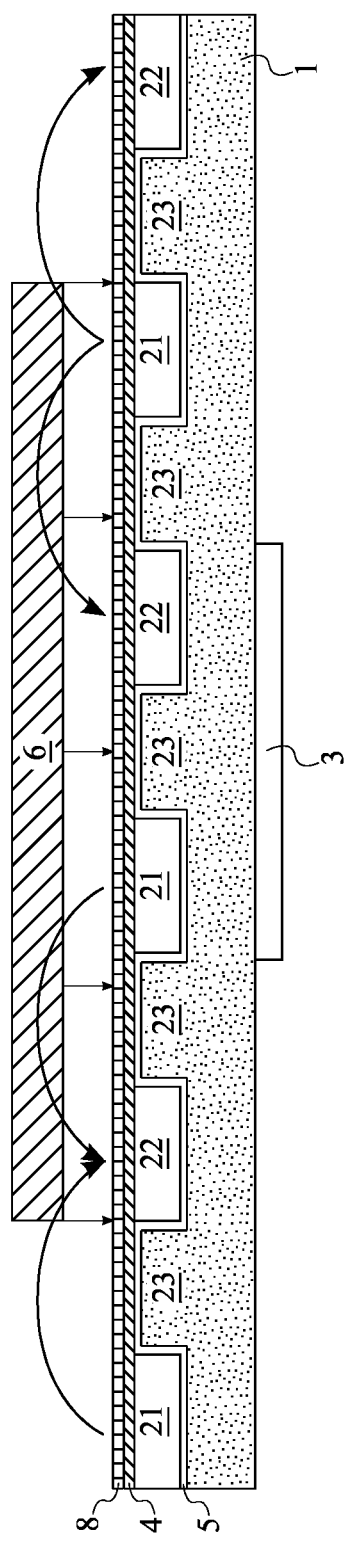
FIG. 11 is a side schematic view of the MESC with the insulative film, the polishing film, and the dielectric thin film, wherein the MESC is implementing an electrostatic field to bond a semiconductive wafer to the MESC.

As can be seen in FIG. 11, a fifth mode of adhesion implemented by the present invention uses a dielectric thin film 8 in order to further adhere the semiconductive wafer 6 onto an electrostatic carrier, which is a generic version of the MESC. The dielectric thin film 8 is used to adjust the relative permittivity between the semiconductive wafer 6 and the electrostatic carrier in order to optimize the bonding force between the semiconductive wafer 6 and the electrostatic carrier. The dielectric thin film 8 is superimposed onto a bonding surface of the electrostatic carrier, which allows the dielectric thin film 8 to be a capstone layer for the electrostatic carrier and therefore allows the dielectric thin film 8 to be an interface between the electrostatic carrier and the semiconductive wafer 6. The dielectric thin film 8 is made of a non-stoichiometric rare-earth compound because the chemical properties of the non-stoichiometric rare-earth compound facilitates adjustment of the relative permittivity between the semiconductive wafer 6 and the electrostatic carrier. The non-stoichiometric rare-earth compound is preferably deposited onto the bonding surface of the electrostatic carrier through an ion-deep-deposition delivery method. However, the non-stoichiometric rare-earth compound can alternatively be deposited onto the bonding surface of the electrostatic carrier through a plasma-spray delivery method, a vapor-phase-evaporation delivery method, a chemical-vapor-deposition delivery method, or other kinds of delivery methods.

More specifically, if the electrostatic carrier is configured as the aforementioned MESC, then the dielectric thin film 8 can be configured to tune capacitance between the positive pole 21, the negative pole 22, and the biased pole 23. Tuning for an increase in capacitance between the positive pole 21, the negative pole 22, and the biased pole 23 allows for a stronger bonding force between the semiconductive wafer 6 and the MESC. In other words, the dielectric thin film 8 tunes an electric field emanating amongst the positive pole 21, the negative pole 22, and the biased pole 23 in accordance to Coulomb's law. In addition, a thickness of the dielectric thin film 8 can be configured to proportionately tune the capacitance between the positive pole 21, the negative pole 22, and the biased pole 23. This is because the relative permittivity between the semiconductive wafer 6 and the MESC increases/decreases with the thickness of the dielectric thin film 8, and the capacitance between the positive pole 21, the negative pole 22, and the biased pole 23 increases/decreases with the relative permittivity between the semiconductive wafer 6 and the MESC.

Furthermore, the dielectric thin film 8 can be configured with different specifications to better adjust the relative permittivity between the semiconductive wafer 6 and the electrostatic carrier. One specification is that the non-stoichiometric rare-earth compound is an yttrium compound, which can be, but is not limited to, yttrium oxide ($Y_2O_3$), yttrium fluoride ($YF_3$), yttria-stabilized zirconia (YSZ). Another specification is that the non-stoichiometric rare-earth compound is an oxidized compound, which can be, but is not limited to, $Y_2O_3$, zirconium oxide ($ZrO_2$), or strontium oxide (SrO). Alternatively, the non-stoichiometric rare-earth compound is an fluoridized compound, which can be, but is not limited to, $YF_3$. Another specification is that a thermal conductivity of the non-stoichiometric rare-earth material is approximately 23 watts per meter-kelvin (W/(m*K)), which is a result of using $Y_2O_3$ as the non-stoichiometric rare-earth material. $Y_2O_3$ is preferably used as the non-stoichiometric rare-earth compound.

Figure 2:
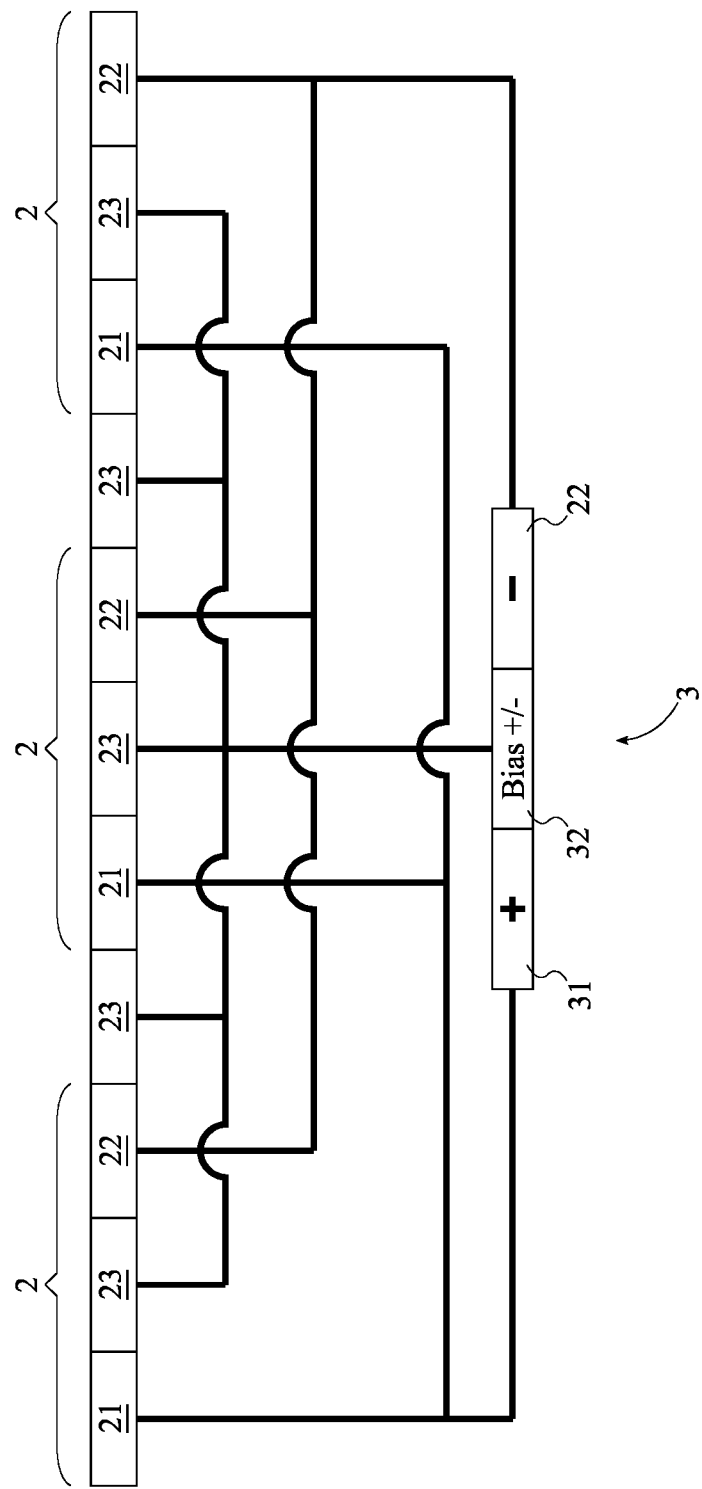
FIG. 2 is a diagram illustrating the electrical connections between the electrostatic field generating circuits and the capacitance charging interface for the MESC.

As can be seen in FIG. 2, the capacitance charging interface 3 is used to selectively charge or discharge the plurality of EFG circuits 2 by adding or depleting the positive pole 21 and the negative pole 22 of their respective electrical charges. The capacitance charging interface 3 will charge the plurality of EFG circuits 2 if the semiconductive wafer 6 needs to be bonded to the present invention. The capacitance charging interface 3 will also discharge the plurality of EFG circuits 2 if the semiconductive wafer 6 needs to be released from the present invention. The capacitance charging interface 3 comprises at least one positive terminal 31, at least one negative terminal 32, and at least one biasing terminal 32, all of which are mounted onto a second face 12 of the doped semiconductive substrate 1. This allows a temporary electrical connection to be made with the capacitance charging interface 3 from the bottom of the present invention while the semiconductive wafer 6 is held on the top of the present invention. The at least one positive terminal 31 is electrically connected to the positive poles 21 of the plurality of EFG circuits 2 so that electrical current can flow from the positive poles 21 to the capacitance charging interface 3 while charging the plurality of EFG circuits 2 and can flow from the capacitance charging interface 3 to the positive poles 21 while discharging the plurality of EFG circuits 2. Similarly, the at least one negative terminal 32 is electrically connected to the negative poles 22 of the plurality of EFG circuits 2 so that electrical current can flow from the capacitance charging interface 3 to the negative poles 22 while charging the plurality of EFG circuits 2 and can flow from the negative poles 22 to the capacitance charging interface 3 while discharging the plurality of EFG circuits 2. In addition, the at least one biasing terminal 32 is electrically connected to the biased pole 23 in order to allow electrical current to flow through the doped semiconductive substrate 1. In the preferred embodiment of the present invention, the at least one positive terminal 31, at least one negative terminal 32, and at least one biasing terminal 32 are mounted onto the second surface 12 of the doped semiconductive substrate 1 so that the capacitance charging interface 3 does not interfere with the positioning of the semiconductive wafer 6 on the first face 11 of the doped semiconductive substrate 1.

Figure 6:
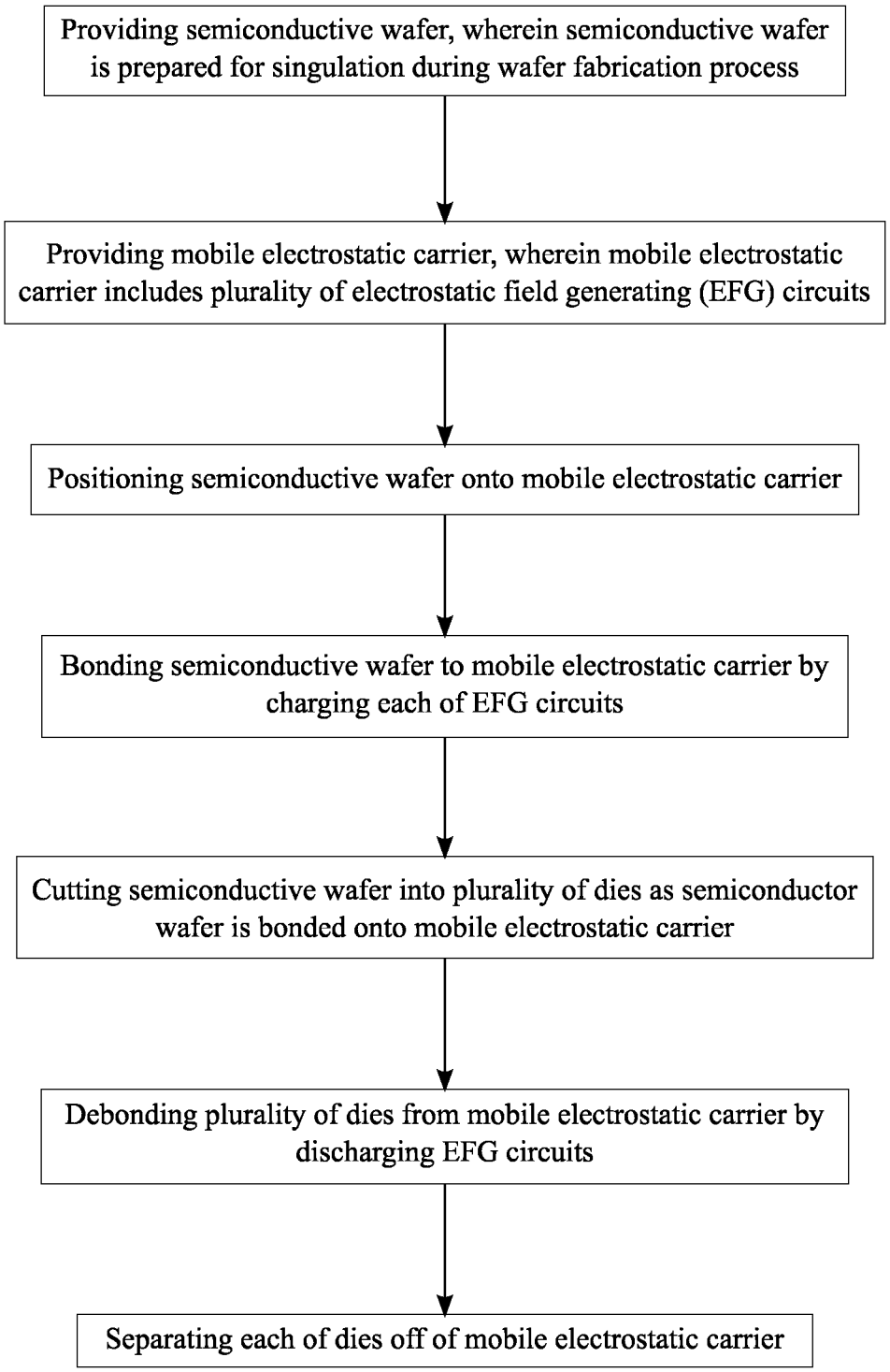
FIG. 6 is a flowchart illustrating how the MESC is used for singulation of a semiconductive wafer during a wafer fabrication process.

The present invention can also be used to make the wafer fabrication process more efficient during singulation of a semiconductive wafer. Typically, before singulation, an integrated circuit is copied and fabricated a number of times on a single piece of semiconductive wafer. Once a semiconductive wafer is prepared for singulation during the wafer fabrication process, the semiconductive wafer and the present invention are processed through the following steps, which are illustrated in FIG. 6. To begin, the semiconductive wafer is positioned onto the present invention in order to properly orient the semiconductive wafer for singulation. The semiconductive wafer is also bonded to the present invention by charging each of the plurality of EFG circuits 2, which holds the semiconductive wafer in place for singulation. These preliminary steps are completed so that the semiconductive wafer can be accurately and precisely cut into a plurality of dies, each of which is manufactured to be an individually functioning integrated circuit on a fractional piece of the semiconductive wafer. The plurality of dies is then debonded from the present invention by discharging the plurality of EFG circuits 2. This allows the plurality of dies to be loosely held on the present invention and consequently allows the plurality of dies to be separated from the present invention, which completes singulation during the wafer fabrication process. Once the present invention discharges the plurality of EFG circuits 2, a pick-and-place machine can typically be used pluck the plurality of dies of off the present invention. Other means common to the art of wafer fabrication can be implemented to separate the plurality of dies from the present invention.

The singulation of a semiconductive wafer is preferably accomplished by means of an etching tool in order to smoothly cut the semiconductive wafer into the plurality of dies. The etching tool is used to secure the present invention in place, which allows the positioning of the semiconductive wafer to remain constant during the mechanical cutting motions of the etching tool. The mechanical cutting motions of the etching tool are then used to etch a trench pattern into the semiconductive wafer so that the trench pattern delineates the divisions amongst the plurality of dies. Deep trenches within the semiconductive wafer is required for singulation, and, thus, the etching tool should be configured for deep reactive-ion etching.

The singulation of a semiconductive wafer requires only the primary mode of adhesion from the present invention, which is to use the electrostatic fields generated by the plurality of EFG circuits 2 to bond to the compositional impurities within the semiconductive wafer. The other modes of adhesion implemented by the present invention (such as intermolecular bonding between flat surfaces and removing trapped gas particles) can be done to further bond the semiconductive wafer to the present invention, but the other modes of adhesion are not necessary for the singulation of the semiconductive wafer.

Figure 12:
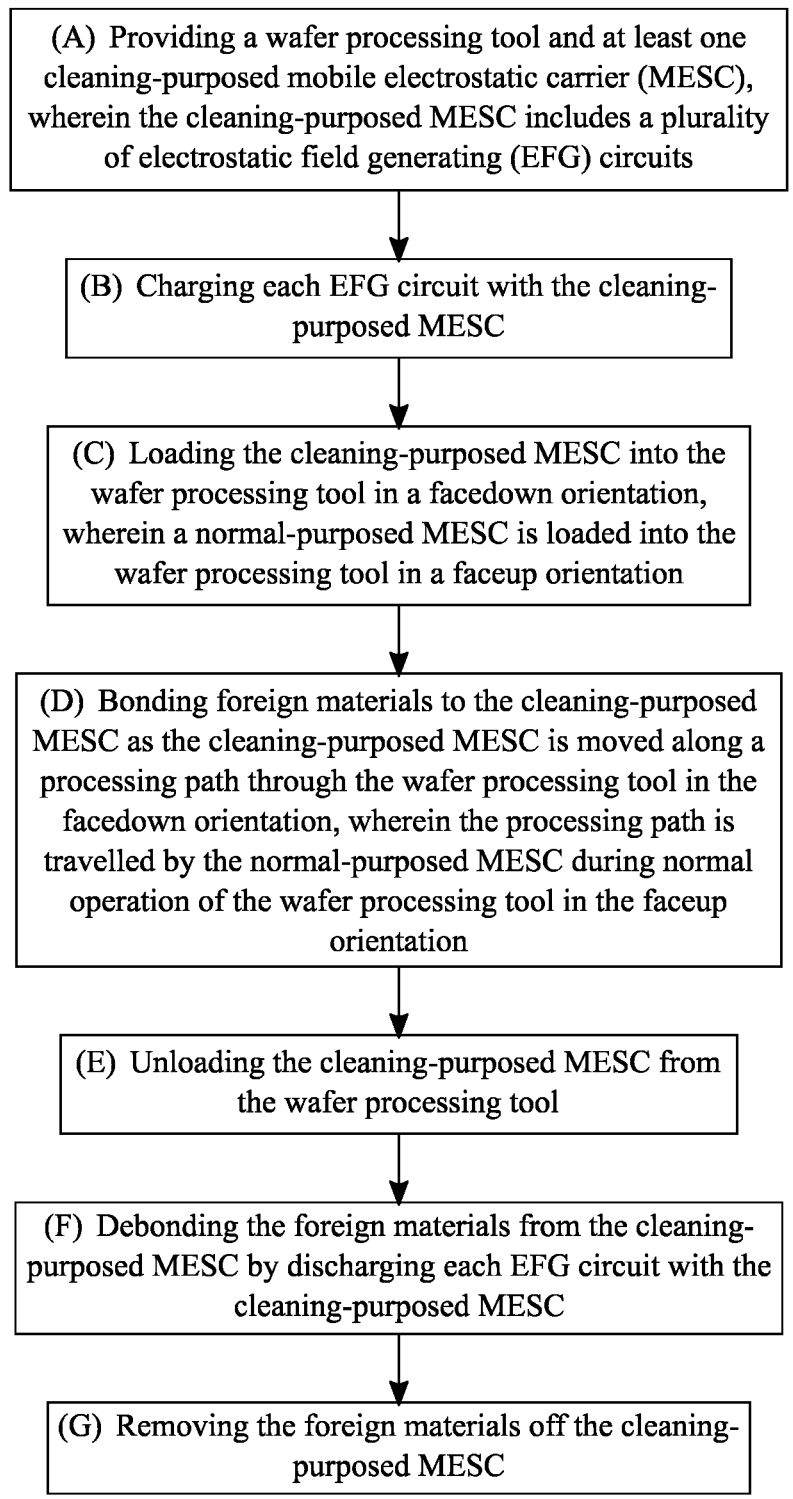
FIG. 12 is a flowchart illustrating an overall process for how the MESC is used for particle abatement in a wafer processing tool.

As can be seen in FIG. 12, the present invention can also be used in a method for particle abatement in a wafer processing tool by allowing the present invention to remove foreign materials from the wafer processing tool without needing to shut down the wafer processing tool for maintenance. Thus, this method requires a wafer processing tool and at least one cleaning-purposed mobile electrostatic carrier (MESC) (Step A). The wafer processing tool is any kind of machine or device that is used to process a semiconductive wafer during manufacturing. The cleaning-purposed MESC is an atypical MESC that cleans portions of the wafer processing tool that regularly accumulate foreign materials. A plurality of electrostatic field generating (EFG) circuits 2 of the cleaning-purposed MESC is used to create a Coulombic attraction force between the cleaning-purposed MESC and foreign material.

The method for particle abatement in a wafer processing tool uses the following steps to effectively and efficiently remove foreign materials from the wafer processing tool. To begin, each EFG circuit 2 is charged with the cleaning-purposed MESC (Step B), which allows the cleaning-purposed MESC to generate a Coulombic attraction force. The cleaning-purposed MESC is then loaded into the wafer processing tool in a facedown orientation (Step C) so that the cleaning-purposed MESC is ready to move through the wafer processing tool. The facedown orientation is defined in relation to a normal-purposed MESC that is loaded into the wafer processing tool in the faceup orientation. The normal-purposed MESC is a typical MESC that is able to mount a semiconductive wafer onto itself and allows for the semiconductive wafer to be loaded into the wafer processing tool during normal operation. In addition, the entrance of the cleaning-purposed MESC into the wafer processing tool does not create a long downtime for maintenance because the cleaning-purposed MESC is made of semiconductor-based materials that regularly enter the wafer processing tool during normal operation. Next, foreign materials are bonded to the cleaning-purposed MESC as the cleaning-purposed MESC is moved along a processing path through the wafer processing tool in the facedown orientation (Step D). The processing path is the path travelled by the normal-purposed MESC during normal operation of the wafer processing tool in the faceup orientation. The foreign materials are particulate that buildup within the wafer processing tool and eventually interfere with forming a secure bond between a semiconductive wafer and a bonding surface of a normal-purposed MESC. Moreover, even if the cleaning-purposed MESC travels along at least some parts of the processing path in an upside-down manner, the foreign materials are securely bonded to the cleaning-purposed MESC.

Upon collecting and capturing the foreign materials onto the cleaning-purposed MESC, the cleaning-purposed MESC is unloaded from the wafer processing tool (Step E) so that the captured foreign materials can also exit the wafer processing tool. The foreign materials are then debonded from the cleaning-purposed MESC by discharging each EFG circuit 2 with the clean-purposed MESC (Step F) in order to loosen the bond between the captured foreign materials and the cleaning-purposed MESC. Finally, the foreign materials are physically removed off the cleaning-purposed MESC (Step G) so that the cleaning-purposed MESC can be reused in another cleaning iteration of the wafer processing tool.

Figure 13:
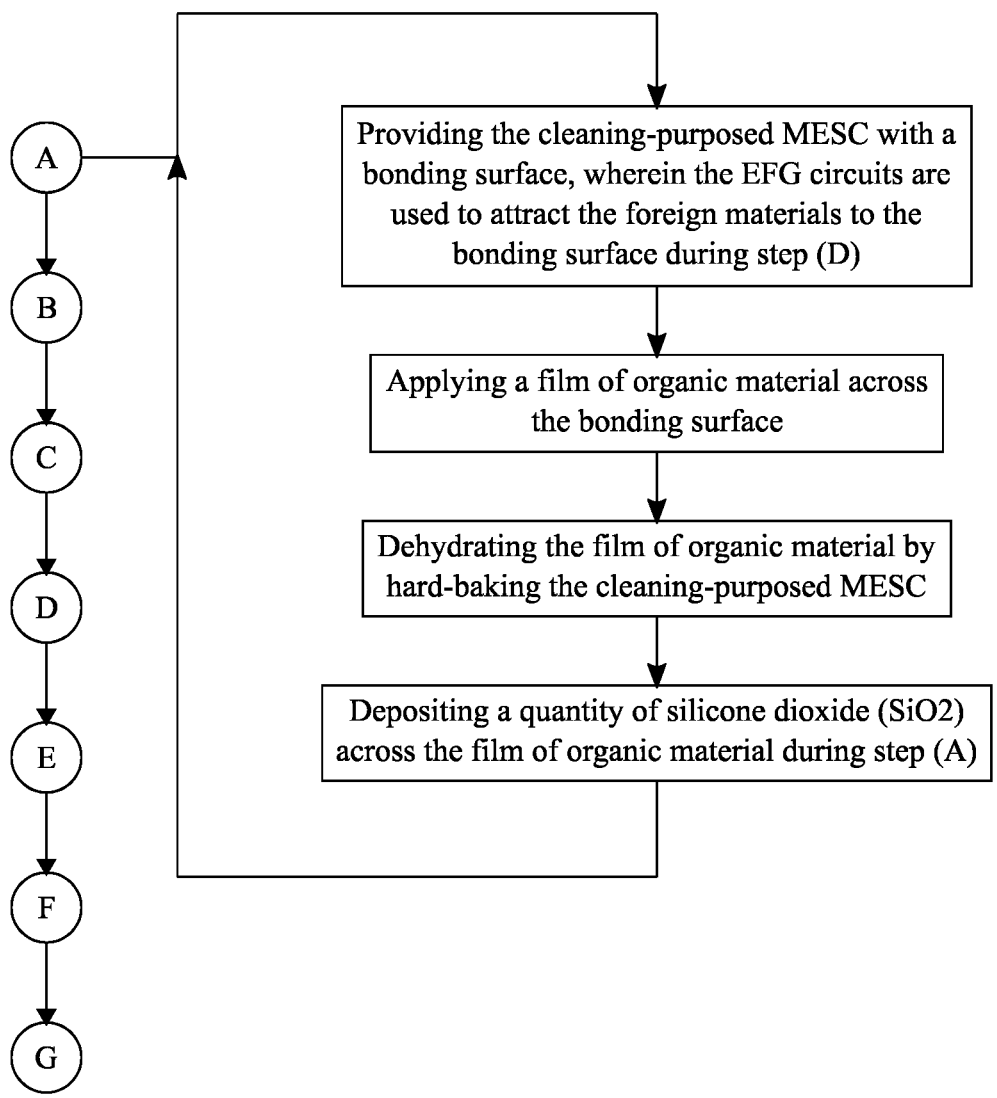
FIG. 13 is a flowchart illustrating a subprocess for how to specifically configure the MESC for particle abatement.

As can be seen in FIG. 13, the cleaning-purposed MESC can be configured to allow the EFG circuits to better attract the foreign materials to a bonding surface of the cleaning-purposed MESC during Step D. Thus, a film of organic material is applied across the bonding surface during Step A, which increases the dielectric constant between poles of each EFG circuit 2 and consequently increases the capacitance between the poles of each EFG circuit 2. This increase in capacitance between the poles of each EFG circuit 2 creates a stronger bonding force between the foreign materials and the cleaning-purposed MESC. The film of organic material is preferably made of polyimide. Moreover, the film of organic material is then dehydrated by hard-baking the cleaning-purposed MESC during Step A, which secures the film of organic material onto the bonding surface. A quantity of silicone dioxide ($SiO_2$) is at last deposited across the film of organic material during Step A, which further increases the dielectric constant between the poles of each EFG circuit 2.

Figure 14:
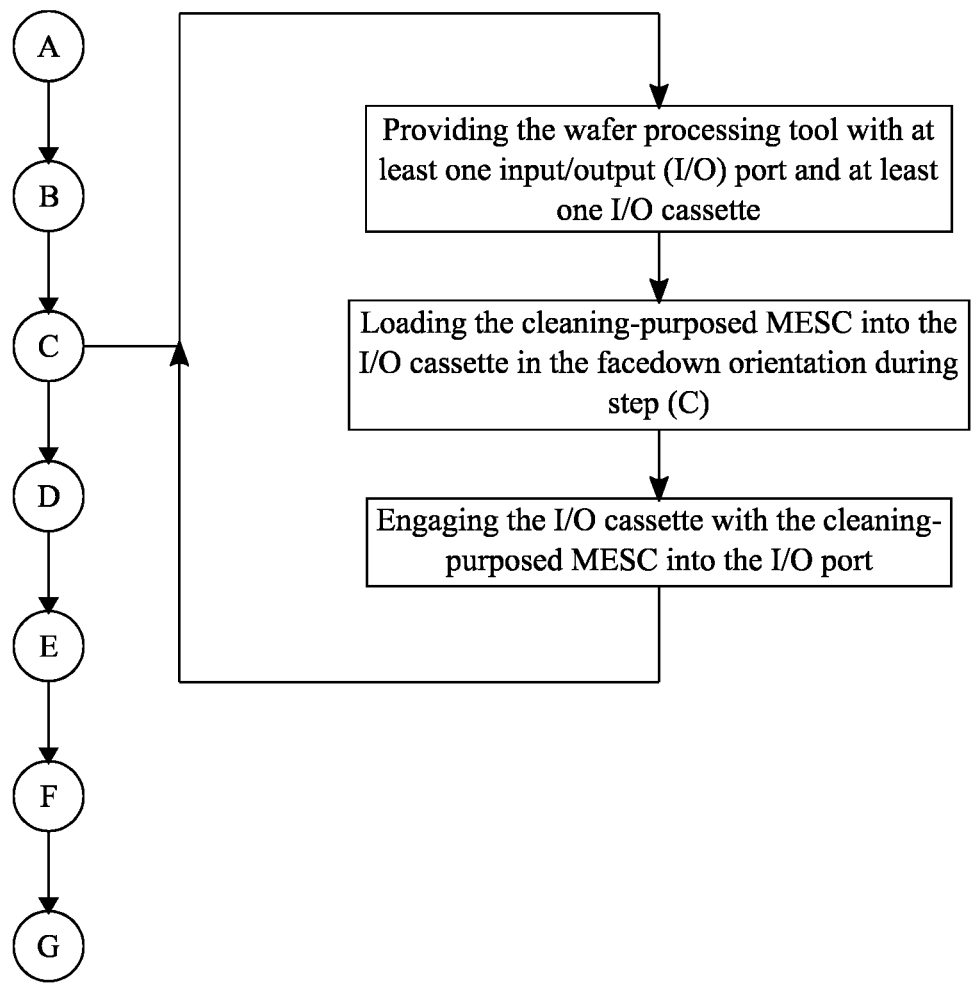
FIG. 14 is a flowchart illustrating a subprocess for how to load the MESC into a wafer processing tool.

As can be seen in FIG. 14, one way of loading the cleaning-purposed MESC in the proper orientation requires that the wafer processing tool is provided with at least one input/output (I/O) port and at least one I/O cassette. The I/O cassette is used to separate and retain an item that is either physically inputted into the wafer processing tool or physically outputted by the wafer processing tool. The I/O cassette is preferably used to separate and retain a semiconductive wafer, a mobile electrostatic carrier, a bonded wafer-carrier assembly, and/or any other kind of dispensable semiconductor-related item. The I/O port is used to either load the I/O cassette into the wafer processing tool or unload the I/O cassette from the wafer processing tool. Thus, the cleaning-purposed MESC is loaded into the I/O cassette in the facedown orientation during Step C, and the I/O cassette with the cleaning-purposed MESC is engaged into the I/O port during Step C. This arrangement allows the cleaning-purposed MESC to initiate and maintain the facedown orientation from Step C until Step E.

Figure 15:
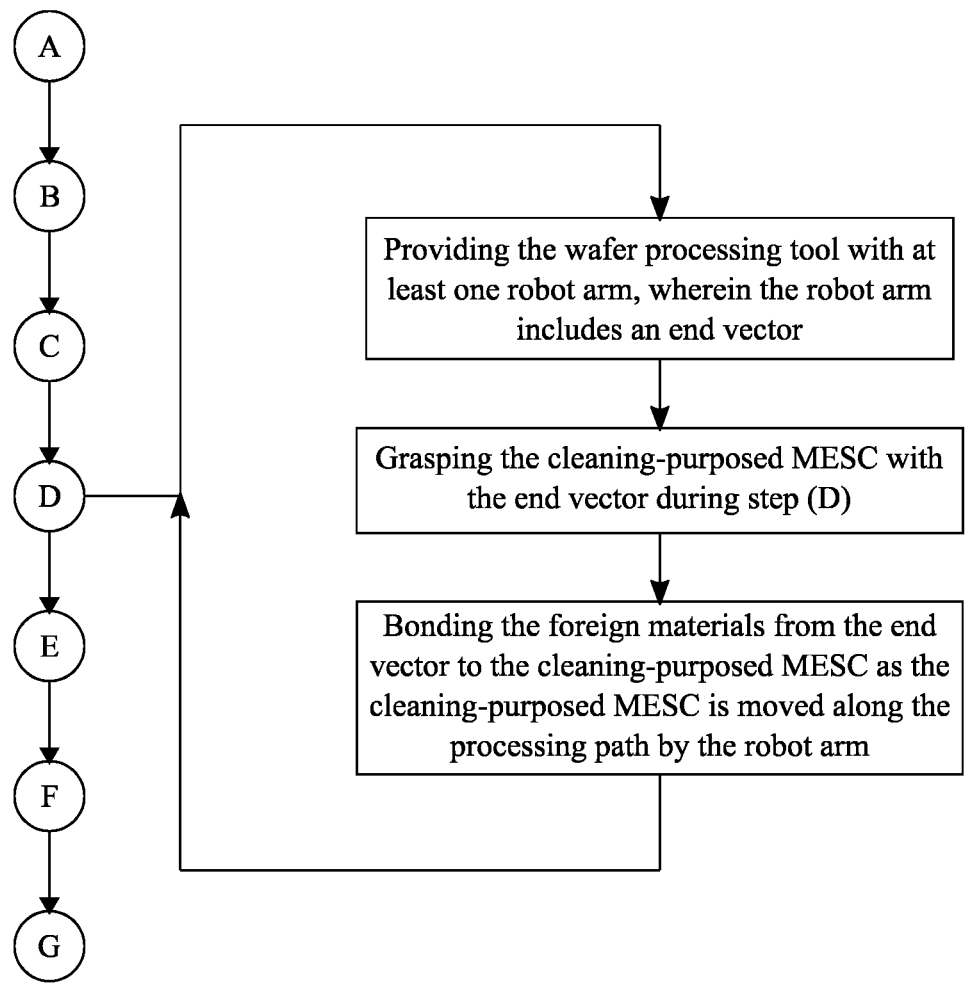
FIG. 15 is a flowchart illustrating a subprocess for how to clean an end vector of a robot arm with the MESC.

As can be seen in FIG. 15, one portion of the wafer processing tool that regularly accumulates foreign materials is at least one robot arm, which is typically used to transport an item through the wafer processing tool. More specifically, an end vector of the robot arm is used to physically touch and hold the item. Thus, the cleaning-purposed MESC is grasped with the end vector during Step D, which allows the foreign materials from the end vector to transfer and bond to the cleaning-purposed MESC as the cleaning-purposed MESC is moved along the processing path by the robot arm. This occurs because the Coulombic attraction force between the cleaning-purposed MESC and foreign materials on the end vector is greater than the Zeta potential between those foreign materials and the end vector.

Figure 16:
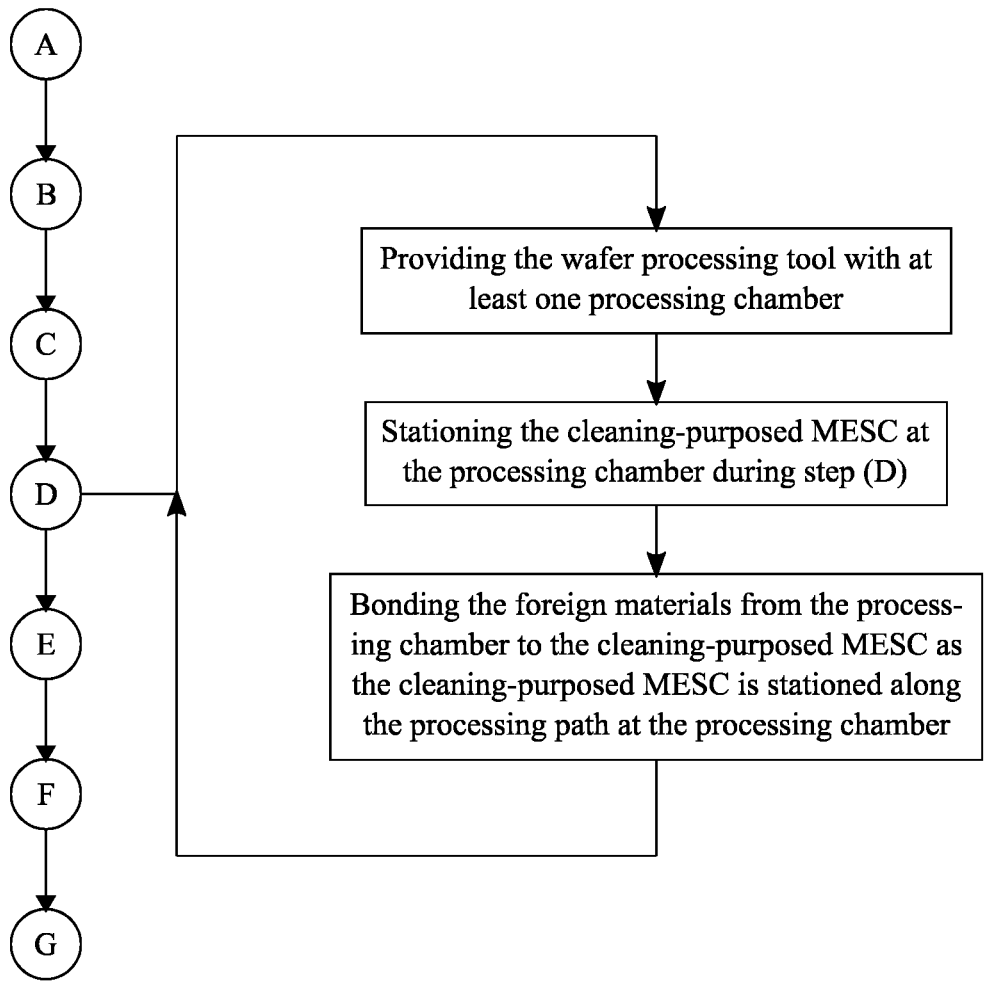
FIG. 16 is a flowchart illustrating a subprocess for how to clean a processing chamber with the MESC.
Figure 17:
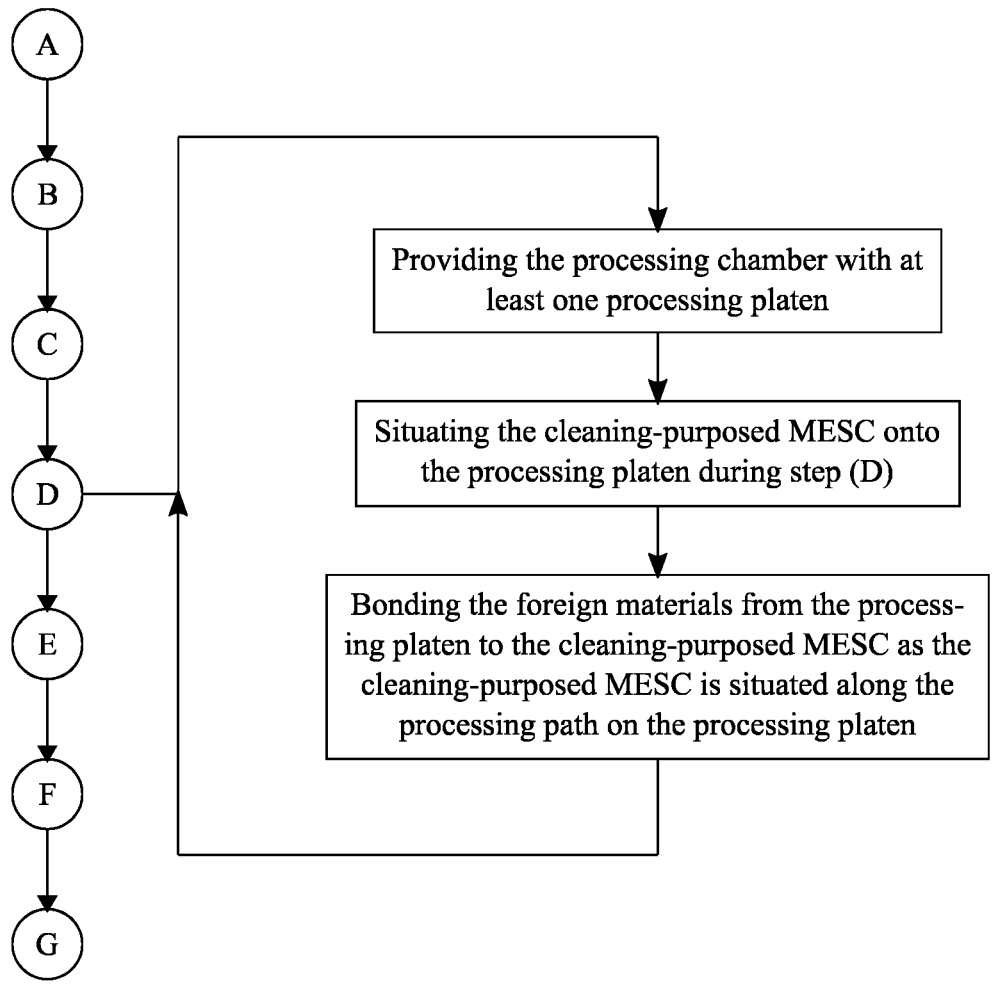
FIG. 17 is a flowchart illustrating a subprocess for how to clean a processing platen with the MESC.

As can be seen in FIG. 16, another portion of the wafer processing tool that regularly accumulates foreign materials is at least one processing chamber, which is typically used to modify an item that was inputted into the wafer processing tool. Thus, the cleaning-purposed MESC is stationed at the processing chamber during Step D, which allows the foreign materials from the processing chamber to transfer and bond to the cleaning-purposed MESC as the cleaning-purposed MESC is stationed along the processing path at the processing chamber. This occurs because the Coulombic attraction force between the cleaning-purposed MESC and foreign materials in the processing chamber is greater than the Zeta potential between those foreign materials and the processing chamber. Furthermore, as can be seen in FIG. 17, if the processing chamber includes at least one processing platen, then those foreign materials may localize onto the processing platen, which is typically used to electrostatically charge or discharge an item entering the processing chamber. Thus, the cleaning-purposed MESC is situated onto the processing platen during Step D, which allows the foreign materials from the processing platen to transfer and bond to the cleaning-purposed MESC as the cleaning-purposed MESC is situated along the processing path on the processing platen. This again occurs because the Coulombic attraction force between the cleaning-purposed MESC and foreign materials on the processing platen is greater than the Zeta potential between those foreign materials and the processing platen.

Although the invention has been explained in relation to its preferred embodiment, it is to be understood that many other possible modifications and variations can be made without departing from the spirit and scope of the invention as hereinafter claimed.

What is claimed is:

1. A method for particle abatement in a wafer processing tool, the method comprising the steps of:
    (A) providing a wafer processing tool and at least one cleaning-purposed mobile electrostatic carrier (MESC), wherein the cleaning-purposed MESC includes a plurality of electrostatic field generating (EFG) circuits;
    (B) charging each EFG circuit with the cleaning-purposed MESC;
    (C) loading the cleaning-purposed MESC into the wafer processing tool in a facedown orientation, wherein a normal-purposed MESC is loaded into the wafer processing tool in a faceup orientation;
    (D) bonding foreign materials to the cleaning-purposed MESC as the cleaning-purposed MESC is moved along a processing path through the wafer processing tool in the facedown orientation, wherein the processing path is travelled by the normal-purposed MESC during normal operation of the wafer processing tool in the faceup orientation;
    (E) unloading the cleaning-purposed MESC from the wafer processing tool;
    (F) debonding the foreign materials from the cleaning-purposed MESC by discharging each EFG circuit with the cleaning-purposed MESC; and
    (G) removing the foreign materials off the cleaning-purposed MESC.

2. The method for particle abatement in a wafer processing tool, the method as claimed in claim 1 comprising the steps of:
    providing the cleaning-purposed MESC with a bonding surface, wherein the EFG circuits are used to attract the foreign materials to the bonding surface during step (D);
    applying a film of organic material across the bonding surface;
    dehydrating the film of organic material by hard-baking the cleaning-purposed MESC; and
    depositing a quantity of silicone dioxide ($SiO_2$) across the film of organic material during step (A).

3. The method for particle abatement in a wafer processing tool, the method as claimed in claim 2, wherein the film of organic material is made of a polyimide.

4. The method for particle abatement in a wafer processing tool, the method as claimed in claim 1 comprising the steps of:
    providing the wafer processing tool with at least one input/output (I/O) port and at least one I/O cassette;
    loading the cleaning-purposed MESC into the I/O cassette in the facedown orientation during step (C); and
    engaging the I/O cassette with the cleaning-purposed MESC into the I/O port.

5. The method for particle abatement in a wafer processing tool, the method as claimed in claim 1 comprising the steps of:
    providing the wafer processing tool with at least one robot arm, wherein the robot arm includes an end vector;
    grasping the cleaning-purposed MESC with the end vector during step (D); and
    bonding the foreign materials from the end vector to the cleaning-purposed MESC as the cleaning-purposed MESC is moved along the processing path by the robot arm.

6. The method for particle abatement in a wafer processing tool, the method as claimed in claim 1 comprising the steps of:
    providing the wafer processing tool with at least one processing chamber;
    stationing the cleaning-purposed MESC at the processing chamber during step (D); and
    bonding the foreign materials from the processing chamber to the cleaning-purposed MESC as the cleaning-purposed MESC is stationed along the processing path at the processing chamber.

7. The method for particle abatement in a wafer processing tool, the method as claimed in claim 6 comprising the steps of:
    providing the processing chamber with at least one processing platen;
    situating the cleaning-purposed MESC onto the processing platen during step (D); and
    bonding the foreign materials from the processing platen to the cleaning-purposed MESC as the cleaning-purposed MESC is situated along the processing path on the processing platen.

* * * * *